United States Patent [19]
Nachumovsky

[11] Patent Number: 6,044,022
[45] Date of Patent: Mar. 28, 2000

[54] PROGRAMMABLE CONFIGURATION FOR EEPROMS INCLUDING 2-BIT NON-VOLATILE MEMORY CELL ARRAYS

[75] Inventor: Ishai Nachumovsky, Zichron Yaakov, Israel

[73] Assignee: Tower Semiconductor Ltd., Migdal Haemek, Israel

[21] Appl. No.: 09/258,059

[22] Filed: Feb. 26, 1999

[51] Int. Cl.[7] .................................................. G11C 16/04
[52] U.S. Cl. ............................. 365/185.28; 365/185.24; 365/185.01
[58] Field of Search ........................ 365/185.01, 185.28, 365/185.18, 185.24

[56] References Cited

U.S. PATENT DOCUMENTS 5,168,334 12/1992 Mitchell et al. .......................... 257/324
5,768,192 6/1998 Eitan .................................... 365/185.24

*Primary Examiner*—David Nelms
*Assistant Examiner*—Hoai V. Ho
*Attorney, Agent, or Firm*—The Law Offices of Bever, Hoffman & Harms, LLP; Patrick T. Bever

[57] ABSTRACT

A structure and method for configuring an EEPROM having an array of 2-bit non-volatile memory transistors to perform either in a high-speed 1-bit operation mode or a high-density 2-bit operation mode. Each memory transistor has a first charge trapping region for storing a first bit and a second charge trapping region for storing a second bit. The selected operation mode is determined by configuration data set by the EEPROM manufacturer in accordance with a customer's requirements. In one embodiment, an EEPROM includes blocks of memory cells accessed by a single word line. When the configuration data indicates the 1-bit operation mode, the memory control circuit stores data in only one of the two charge trapping regions of each memory cell. All eight bits of a word are read simultaneously by accessing eight separate charge trapping regions. Conversely, when the configuration data indicates the 2-bit operation mode, the memory control circuit stores data in both charge trapping regions of each memory cell. A read operation in the 2-bit operation mode requires reading a first group of four bits during a first stage, and then reading a second group of four bits during a second stage. These first and second groups of bits are successively stored in a shift register, and then transmitted to an I/O control circuit.

16 Claims, 9 Drawing Sheets

PROGRAMMABLE CONFIGURATION FOR EEPROMS INCLUDING 2-BIT NON-VOLATILE MEMORY CELL ARRAYS

FIELD OF THE INVENTION

The present invention relates to non-volatile memory cells. More specifically, the present invention relates to a method and structure for programmable configuring an EEPROM including an array of 2-bit non-volatile memory cells to selectively operate as either a fast, low-density mode, or in a relatively slow, high-density mode.

RELATED ART

FIG. 1 is a cross sectional view of a conventional 1-bit non-volatile semiconductor memory cell 10 that utilizes asymmetrical charge trapping. 1-bit memory cell 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A programming operation is performed by connecting source region 14 to ground, connecting drain region 16 to a programming voltage of about 9 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within charge trapping region 26 in nitride layer 20.

Memory cell 10 is read by applying 0 Volts to the drain region 16, 2 Volts to the source region 14, and 3 volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192.

Memory cell 10 can also be controlled to operate as a 2-bit non-volatile semiconductor memory cell. To accomplish this, memory cell 10 is controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 9 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in unperturbed electronic transfer in the pinch off region adjacent to first charge trapping region 26. Thus, the information stored in the first and second charge trapping regions 26 and 28 is read properly.

Similarly, if both the first and second charge trapping regions are programmed, a read operation in either direction will result in no significant current flow. Finally, if neither the first charge trapping region 26 nor the second charge trapping region 28 is programmed, then read operations in both directions will result in significant current flow.

Because the 1-bit and 2-bit implementations of memory cell 10 are relatively new, the manner of using this memory cell 10 in a memory cell array has not yet been fully developed.

It would therefore be desirable to have a memory array structure that allows memory cell 10 to be implemented as an electrically erasable programmable read only memory (EEPROM). For purposes of this disclosure, an EEPROM is defined as a memory circuit including a non-volatile memory array that can be erased on a word-by-word basis. This is in contrast to a flash memory circuit, which is defined as including a non-volatile memory array that cannot be erased on a word-by-word basis, but which must be erased in blocks.

It would further be desirable if a single memory array could be programmed to operate in either the 1-bit cell implementation, which can be used to produce EEPROMs having high-speed read capabilities, or the 2-bit cell implementation, which can be used to produce high-density EEPROMs.

SUMMARY

Accordingly, the present invention provides structures and methods for implementing an EEPROM using 2-bit non-volatile memory transistors that is selectively controlled to operate in either a high-speed 1-bit operation mode, or in a high-density 2-bit operation mode. The selected operation mode is determined by configuration data stored on the EEPROM by the EEPROM manufacturer in accordance with a customer's requirements. For example, when a customer requests a high-speed EEPROM, the configuration data is set such that the EEPROM operates in the 1-bit operation mode. Conversely, when high-density is required, the configuration data is set such that the EEPROM operates in the 2-bit operation mode. Therefore, the present invention simplifies the manufacturing process by providing a single structure that can be modified without changing fabrication procedures to produce EEPROMs that meet a variety of customer requirements. This reduces design efforts and associated costs because only a single module type is used to produce the memory array portions of these EEPROMs.

In accordance with a first embodiment of the present invention, an EEPROM includes an array of non-volatile 2-bit memory cells, a memory control circuit for generating signals utilized to access data bits stored in the array, and a mode control circuit for storing configuration data. The array includes blocks having memory cells accessed by a single word line. The configuration data is read by the memory control circuit when power is applied to the EEPROM. When the configuration data indicates the 1-bit operation mode, the memory control circuit stores data in only one (i.e., the left charge trapping region) of the two charge trapping regions of each memory cell (i.e., the right charge trapping region is not used). Conversely, when the configuration data indicates the 2-bit operation mode, the memory control circuit stores data in both (i.e., the left and the right) charge trapping regions of each memory cell.

The 1-bit operation mode facilitates relatively fast read operations because all eight data bits of a word are read simultaneously. That is, each eight-bit word is stored in selected (e.g., the right) charge trapping regions of eight separate memory cells that are coupled to a particular word line of the memory array. When the EEPROM receives a command to read the word, the memory control circuit accesses all eight selected charge trapping regions simultaneously, thereby passing all eight bits in parallel to an output terminal and facilitating relatively high-speed read operations. During program/erase operations, because only one charge trapping region is used, data can be erased and written on a word-by-word basis, thereby providing true EEPROM functionality. However, because only one of the two charge trapping regions of each memory cell is utilized to store data, the high-speed read capability associated with the 1-bit operation mode sacrifices 50% of the potential storage capacity of the memory array.

In contrast, when the EEPROM is operated in the 2-bit operation mode, both charge trapping regions of each memory cell are accessed to store data. As discussed in the background section (above), in order to erase a first charge trapping region of a first memory cell, it is also necessary to erase a second charge trapping region of an adjacent memory cell. To provide true EEPROM functionality, the first charge trapping region of the first memory cell and second charge trapping region of the adjacent memory cell must be part of the same word. Because bits are stored in adjacent memory cells, the 2-bit operation mode requires data to be read in four-bit groups during two stages. The first group of four bits read during a first stage is stored, for example, in a shift register, and then the second group of four bits is read during a second stage. The first and second groups are combined in the shift register, and the resulting eight-bit word is then transmitted to the output terminal. Because the read operation requires two stages to access all eight bits, a read operation in the 2-bit operation mode is relatively slower than a read operation in the 1-bit operation mode. However, in contrast to the 1-bit operation mode, the 2-bit operation mode allows high-density EEPROM operations because 100% of the storage capacity of the memory array is available to store data.

In accordance with a second embodiment of the present invention, an EEPROM includes an array of non-volatile 2-bit memory cells arranged in blocks formed such that two rows of memory cells are accessed by a two word lines. The additional row of memory cells can be added to the array without significantly increasing the space of the array because the size of each memory cell is much smaller than that of the select transistors used in each block. The configuration data indicates 1-bit, 2-bit or 4-bit operation modes. During the 1-bit and 2-bit operation modes, the memory control circuit accesses memory cells in one of the two rows in the manner set forth above according to the first embodiment. During the 4-bit operation mode, the memory control circuit accesses data stored in both (i.e., the left and the right) charge trapping regions in both rows, wherein each eight-bit word is stored in four memory cells that are coupled to two bit lines. Accordingly, a read operation requires four stages, each stage providing a group of two data bits. These groups of data bits are stored in, for example, a shift register until all eight bits are read. Then, the eight-bit word is transmitted to an output terminal of the EEPROM. As such, the 4-bit operation mode requires twice the amount of time required to read a word in the 2-bit operation mode, and four times that required in the 1-bit operation mode. However, significantly greater storage capacity is provided with a minimal increase in the size of the array, thereby providing further manufacturing flexibility.

In accordance with a third embodiment of the present invention, an EEPROM includes an array of non-volatile 2-bit memory cells arranged in blocks formed such that four rows of memory cells are accessed by a four word lines. The configuration data indicates 1-bit, 2-bit, 4-bit or 8-bit operation modes. The 1-bit, 2-bit and 4-bit operation modes are performed in a manner similar to that used in the first and second embodiments. During the 8-bit operation mode, the memory control circuit accesses data stored in both (i.e., the left and the right) charge trapping regions in all four rows, wherein each eight-bit word is stored in four memory cells that are coupled to one bit line. Accordingly, a read operation requires eight stages, each stage providing one data bit. These data bits are stored in, for example, a shift register until all eight bits are read. Then, the eight-bit word is transmitted to an output terminal of the EEPROM. As such, the 8-bit operation mode requires four times the amount of time required to read a word in the 2-bit operation mode, and eight times that required in the 1-bit operation mode. However, significantly greater storage capacity is provided with a minimal increase in the size of the array, thereby providing further manufacturing flexibility.

The present invention will be more fully understood in view of the following description and drawings.

DETAILED DESCRIPTION

Figure 2:
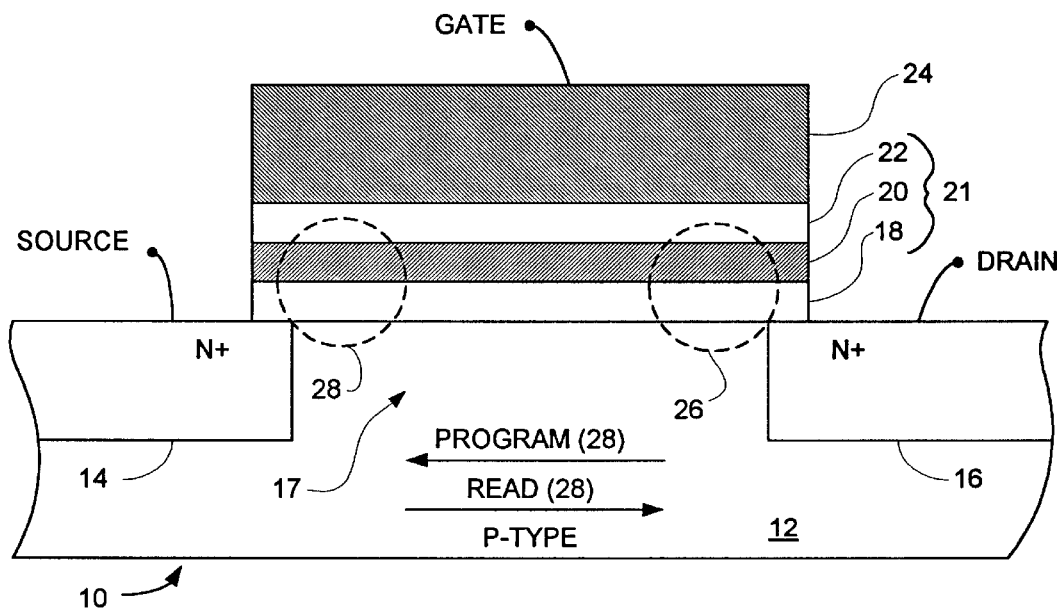
FIG. 2 is a cross sectional diagram illustrating a conventional 2-bit non-volatile memory cell.
Figure 3:
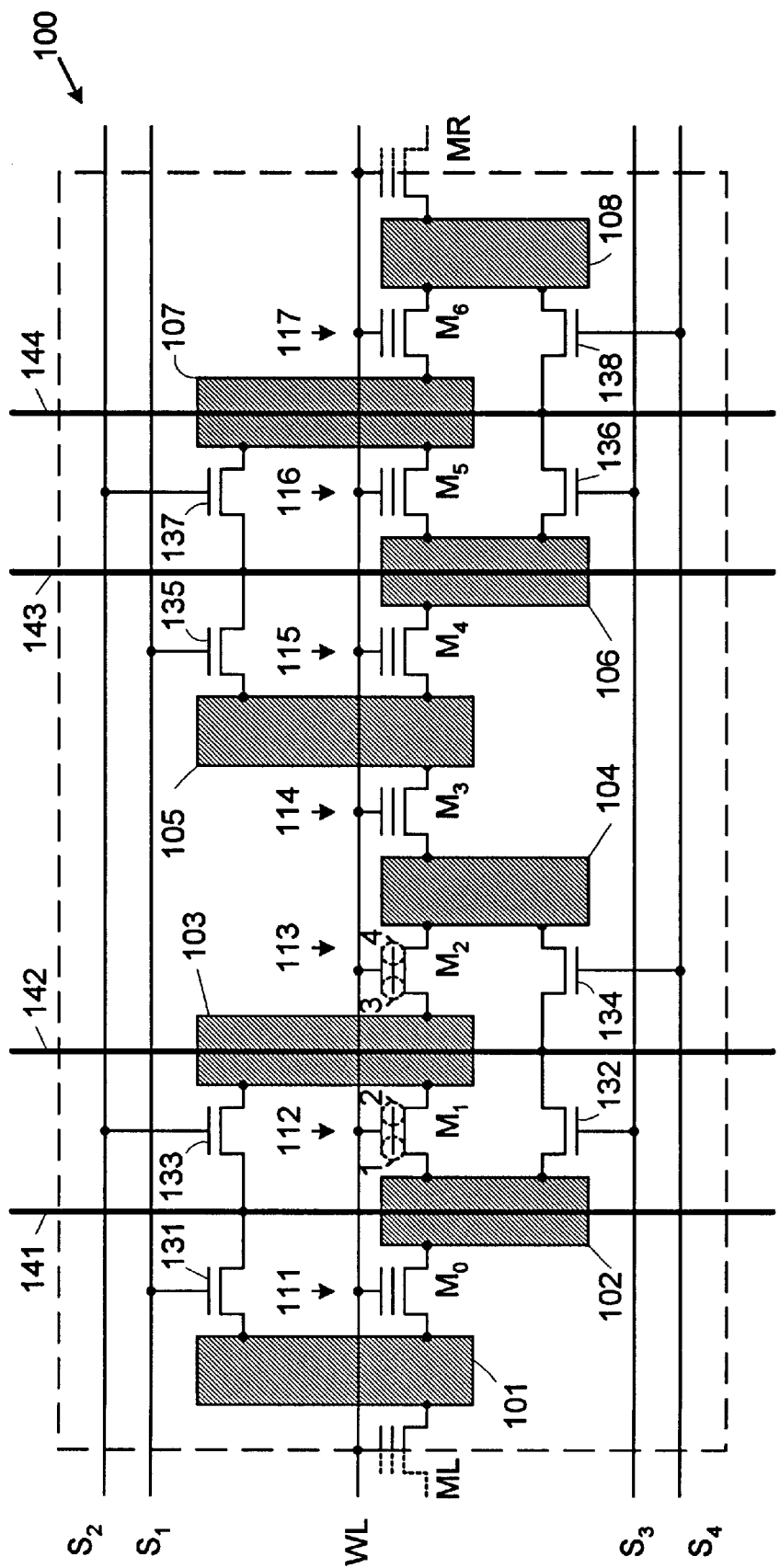
FIG. 3 is a schematic diagram illustrating a memory block utilized in accordance with a first embodiment of the present invention.

FIG. 3 is a schematic diagram illustrating a memory block 100 in accordance with a first embodiment of the present invention. Memory block 100 uses a plurality of 2-bit memory cells identical to 2-bit memory cell 10 (FIG. 2). In particular, memory block 100 includes seven full memory cells $M_0$ through $M_6$, and two partial memory cells MR and ML that are shared with adjacent memory blocks. These memory cells are arranged in a row that extends along a first axis, and are connected to metal bit lines 141–144 that extend along a second axis, perpendicular to the first axis.

Each of the seven full memory cells $M_0$ through $M_6$ includes two charge trapping regions, namely, a left charge trapping region and a right charge trapping region. For example, the charge trapping regions of memory cell $M_1$ are labeled as left charge trapping region 1 and right charge trapping region 2. Similarly, the charge trapping regions of memory cell $M_2$ are labeled as left charge trapping region 3 and right charge trapping region 4.

The source and drain regions of memory cells $M_0$–$M_6$ are formed by diffused regions 101–108, which extend in parallel along the second axis. As described in more detail below, in some embodiments, diffused regions 101–108 also operate as bit lines within memory block 100. Consequently, diffused regions 101–108 are hereinafter referred to as diffusion bit lines.

ONO structures 111–117 are located between adjacent diffusion bit lines 101–108. For example, ONO structure 111 is located between diffusion bit lines 101 and 102. The gates of the memory cells $M_0$–$M_6$ are commonly connected to a word line WL.

Figure 4:
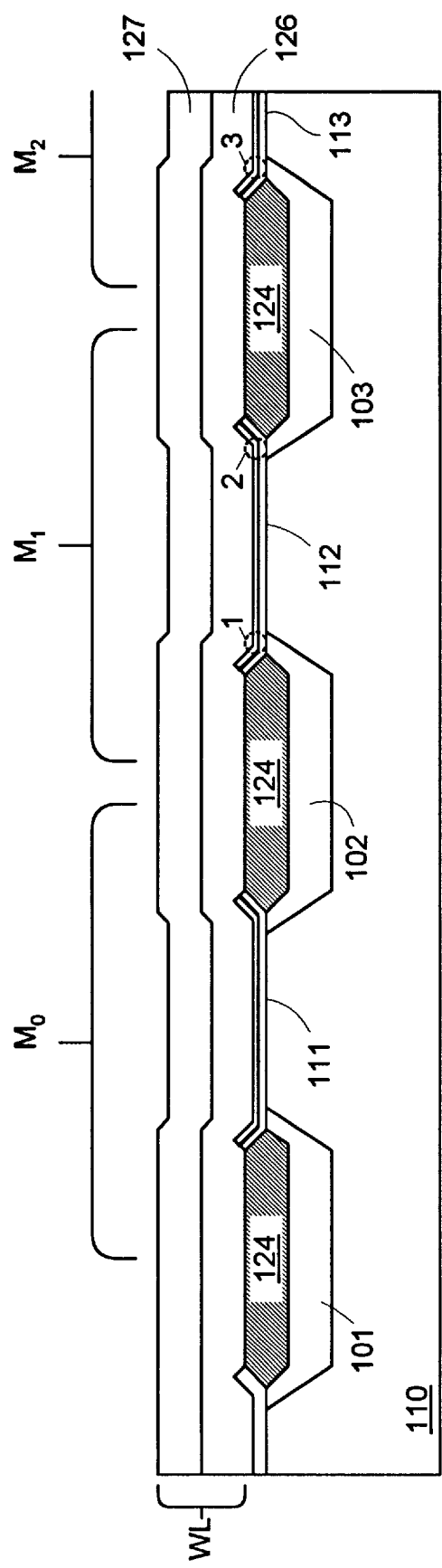
FIG. 4 is a cross sectional view of selected memory cells of FIG. 3, taken along a word line.

FIG. 4 is a cross sectional view of memory cells $M_0$ and $M_1$ along the first axis through word line WL. Diffusion bit lines 101–103 are n-type regions formed in a p-type silicon semiconductor substrate 110. Diffusion bit lines 101–103 can also be formed in a p-well region. Bit line insulating regions 124 are formed over the diffusion bit lines 101–103. Bit line insulating regions 124 can be, for example, silicon oxide having a thickness of approximately 600 Å. Note that bit line insulating regions 124 are an order of magnitude thinner than conventional field oxide. Because the memory cells in memory block 100 do not require field oxide for isolation, memory block 100 can be referred to as a fieldless array. ONO structures 111 and 112 extend over bit line insulating regions 124, diffusion bit lines 101–103 and substrate 110 in the manner illustrated. Word line WL, which is a polycide or salicide structure that includes a layer of conductivity doped polycrystalline silicon 126 and an overlying layer of metal silicide 127, extends over ONO structures 111 and 112 (and bit line insulating regions 124). Word line WL forms the control gates of memory cells $M_0$ and $M_1$. The above-described structures of memory block 100 are fabricated using flash processing steps. The fabrication of memory block 100 is described in more detail in co-owned U.S. patent application Ser. No. 09/244,316, entitled "METHODS FOR FABRICATING A SEMICONDUCTOR CHIP HAVING CMOS DEVICES AND A FIELDLESS ARRAY", filed Feb. 4, 1999, which is hereby incorporated by reference.

Returning now to FIG. 3, the 2-bit memory cells of memory block 100 are accessed through high-voltage select transistors 131–138 and metal bit lines 141–144. Metal bit lines 141–144 are located in an interconnect layer that extends over the above-described elements of memory block 100. High-voltage select transistors 131–138 are designed to have gate oxide sufficient to withstand the high voltages required for programming and erasing the memory cells. In general, select transistors 131–138 are controlled to selectively connect metal bit lines 141–144 to diffusion bit lines 101–108. The first power terminals of select transistors 131–138 are coupled to diffusion bit lines 101–108, respectively. The second power terminals of select transistors 131 and 133 are coupled to metal bit line 141. The second power terminals of select transistors 132 and 134 are coupled to metal bit line 142. The second power terminals of select transistors 135 and 137 are coupled to metal bit line 143. The second power terminals of select transistors 136 and 138 are coupled to metal bit line 144. The gates of select transistors 131 and 135 are commonly connected to a first select line $S_1$, while the gates of select transistors 133 and 137 are commonly connected to a second select line $S_2$. Similarly, the gates of select transistors 132 and 136 are commonly connected to a third select line $S_3$, while the gates of select transistors 134 and 138 are commonly connected to a fourth select line $S_4$.

The memory cells in memory block 100 are accessed as follows. Two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two memory cells to the metal bit lines 141–144.

For example, when select lines $S_2$ and $S_3$ are pulled high, and select lines $S_1$ and $S_4$ are pulled low, metal bit lines 141–142 are coupled to access memory cell $M_1$, and metal bit lines 143–144 are coupled to access memory cell $M_6$. More specifically, the logic high select lines $S_2$ and $S_3$ cause select transistors 132, 133, 136 and 137 to turn on, and the logic low select lines $S_1$ and $S_4$ cause select transistors 131, 134, 135 and 138 to turn off. Consequently, diffusion bit line 102 is coupled to metal bit line 142 and diffusion bit line 103 is coupled to metal bit line 141. Similarly, diffusion bit line 106 is coupled to metal bit line 144 and diffusion bit line 107 is coupled to metal bit line 143. As a result, signals provided on metal bit lines 141 and 142 are provided to control memory cell $M_1$, and signals provided on metal bit lines 143 and 144 are provided to control memory cell $M_6$ of memory block 100.

Referring again to FIG. 3, shared memory cells MR and ML are provided at the ends of memory block 100. Shared memory cells MR and ML allow a plurality of memory blocks, identical to memory block 100, to be coupled together along the first axis, thereby forming a larger memory array. Shared memory cells MR and ML are formed at the interfaces between memory blocks along the first axis. More specifically, the right-most shared memory cell MR of one memory block combine with the left-most shared memory cell ML of an adjacent memory block to form another column of memory cells. Stated another way, the right-most diffusion bit line of one memory block combines with the left-most diffusion bit line of an adjacent memory block (along with the ONO layer located there between) to form a shared column of memory cells. This shared column of memory cells is accessed by the right-most metal bit line in a memory block and the left-most metal bit line in the right-adjacent memory block. This shared column of memory cells is accessed when select lines $S_1$ and $S_4$ are pulled high and select lines $S_2$ and $S_3$ are pulled low. Note that under these conditions, access is provided to the following memory cells in memory block 100: shared memory cell ML, shared memory cell MR and memory cell $M_3$. Because each shared memory cell counts as a half memory cell within memory block 100, there are effectively two accessed memory cells within memory block 100 under these conditions. Shared memory cells MR and ML are described in additional detail in co-owned and co-pending U.S. patent application Ser. No. 09/244,529, entitled "EEPROM ARRAY USING 2-BIT NON-VOLATILE MEMORY CELLS AND METHOD OF IMPLEMENTING SAME", filed Feb. 4, 1999, which is incorporated herein by reference in its entirety.

Access having been provided to all of the memory cells, program, read and erase operations for one charge trapping region (i.e., one bit) are performed as follows.

A single bit of memory block 100 is read as follows. Word line WL is maintained at a read voltage of 3 volts. One of the diffusion bit lines of the selected memory cell is held at a voltage of 2 Volts, and the other diffusion bit line of the selected memory cell is coupled to a sense amplifier (and held at a voltage of about 0 Volts) such that a reverse read condition exists for the selected memory cell. For example, to read the right charge trapping region 2 of memory cell $M_1$, word line WL is held at a voltage of 3 Volts, 2 Volts is applied to diffusion bit line 102, and diffusion bit line 103 is coupled to a sense amplifier (0 Volts). With these applied voltage levels, a reverse read condition is created for right charge trapping region 2 of memory cell $M_1$. Note that all other word lines of the EEPROM (not shown) connected to metal bit lines 141–144 are held at 0 Volts. Under these conditions, the non-selected memory cells of the EEPROM are neither read nor disturbed.

For a programming operation, the word line associated with the selected memory cell is held at a programming voltage of 11 volts, while the word lines associated with non-selected memory cells of other memory blocks (not shown) are held at a voltage of 0 Volts. The source region of the selected memory cell is maintained at a voltage of 0 Volts, and the drain region of the selected memory cell is maintained at a voltage of 5.5 Volts. For example, to program the right charge trapping region 2 of memory cell $M_1$, word line WL is held at a voltage of 11 Volts, 5.5 Volts is applied to diffusion bit line 103, and a voltage of 0 Volts is applied to diffusion bit line 102. With these applied voltages, a program condition is created for right charge trapping region 2 of memory cell $M_1$. The duration of the programming operation is on the order of micro-seconds. Note that the duration of the programming operation is not long enough and the applied drain voltage of 5.5 Volts is not high enough to disturb non-selected memory cells of the EEPROM (not shown) during the programming operation.

Unlike read and programming operations, which can be directed to a single charge trapping region, erase operations in memory block 100 cannot be limited to a single charge trapping region. An erase operation is performed by floating the gate of a selected memory cell and applying 8 Volts to the drain region of the selected memory cell. For example, to erase the right charge trapping region 2 of memory cell $M_1$, the select transistors 132 and 133 are turned on, thereby coupling metal bit lines 141 and 142 to diffusion bit lines 103 and 102, respectively. An erase voltage of 8 Volts is applied to diffusion bit line 103, and word line WL is left floating. Under these conditions, the right charge trapping region 2 of memory cell $M_1$ is erased. However, under these conditions, the left charge trapping region 3 of the adjacent memory cell $M_2$ is subjected to the same erase conditions, and is therefore also erased. Consequently, each erase operation applies erase conditions to charge trapping regions in adjacent memory cells. As discussed in further detail below, the use of memory block 100 in an EEPROM is affected by the erase operation because these charge trapping regions must be associated with a single word.

With the general operation of memory block 100 having been described, a memory structure and associated 1-bit and 2-bit operation modes according to the first embodiment of the present invention will now be provided with reference to FIGS. 5 through 8.

Figure 5:
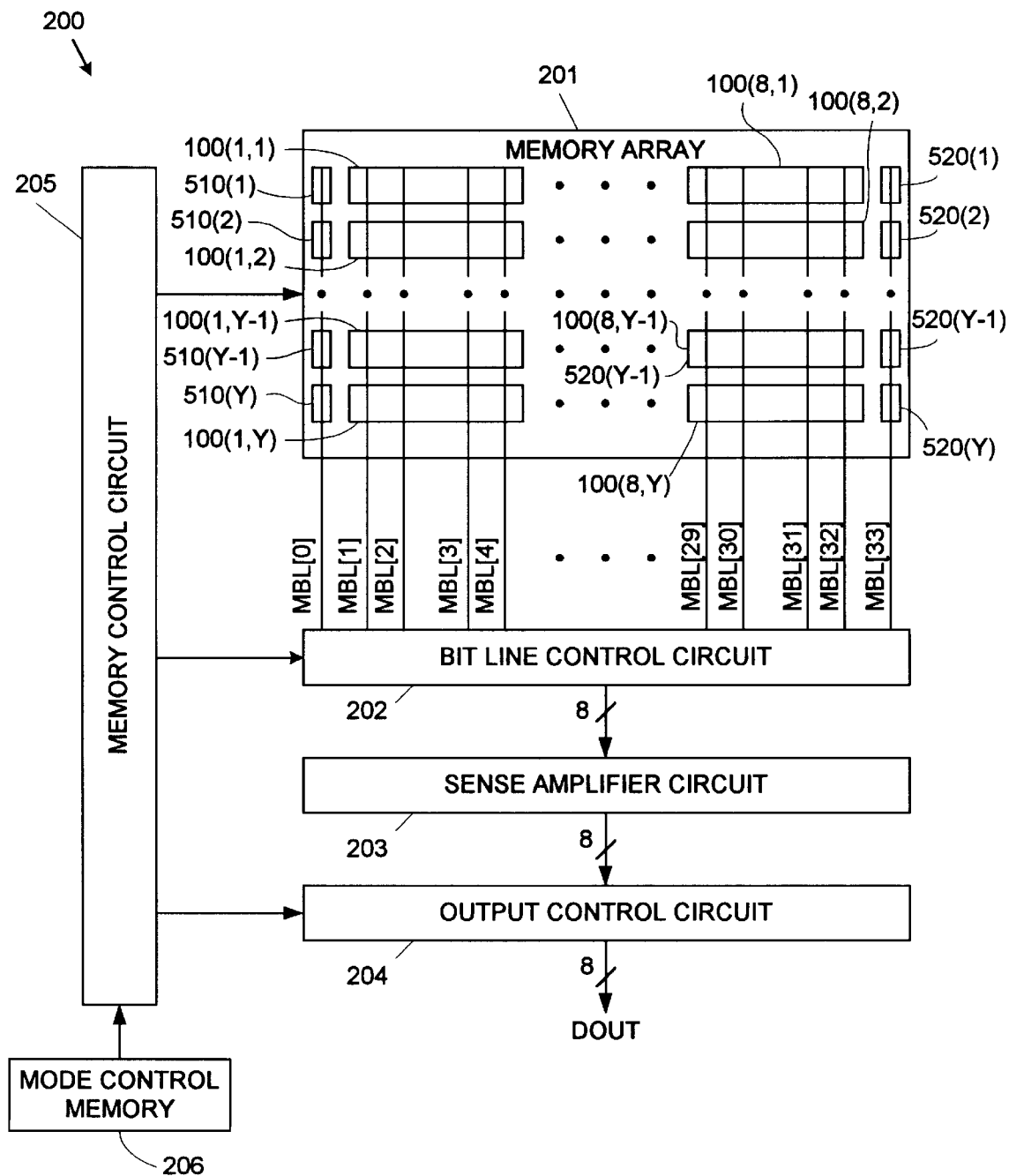
FIG. 5 is a block diagram of a memory system that implements the memory block of FIG. 3 in accordance with the first embodiment.

FIG. 5 is a block diagram of an EEPROM 200 that uses memory blocks 100 in accordance with an embodiment of the present invention. EEPROM 200 includes memory array 201, bit line control circuit 202, sense amplifier circuit 203, I/O control circuit 204, memory control circuit 205 and mode control memory 206.

Memory array 201 includes memory blocks arranged in eight columns and Y rows, each memory block being identical to memory block 100 (see FIG. 3). For example, memory array 201 includes a first column of memory blocks 100(1,1) to 100(1,Y), and an eighth column of memory blocks 100(8,1) to 100(8,Y). Each column of memory blocks is connected to an associated group of metal bit lines. For example, the first column is connected to metal bit lines MLB[1] through MLB[4], and the eighth column is connected to metal bit lines MLB[29] through MLB[32]. The memory blocks in memory array 201 are also arranged in rows that share select signals and word lines. For example, the select signals and word line signals transmitted to memory block 100(1,1) are also received by memory block 100(8,1). Finally, supplemental bit lines 510(1) through 510(Y) and 520(1) through 520(Y) are located at the right and left ends of each row that respectively provide access to the partial memory cells ML (see FIG. 3) of memory blocks 100(1,1) through 100(1,Y) and partial memory cells MR of memory blocks 100(8,1) through 100(8,Y).

Bit line control circuit 202 applies the appropriate read, program and erase voltages to the metal bit lines MBL[0] through MBL[33] in response to control signals received from memory control circuit 205. During a read operation, bit line control circuit 202 also routes data bits from selected metal bit lines MBL[1] through MBL[32] to sense amplifier circuit 203 in response to a column address received from memory control circuit 205. A suitable bit line control circuit 202 is described in commonly-owned U.S. patent application Ser. No. 98/243,976, entitled "BIT LINE CONTROL CIRCUIT FOR A MEMORY ARRAY USING 2-BIT NON-VOLATILE MEMORY CELLS", filed Feb. 4, 1999, which is hereby incorporated by reference in its entirety.

During read operations, sense amplifier 203 detects signal levels on eight of the metal bit lines MBL[1] through MBL[32] that are passed through bit line control circuit 202.

In response to these signal levels, sense amplifier 203 generates bit data signals that are passed to I/O control circuit 204.

I/O control circuit 204 is coupled to receive bits from sense amplifier circuit 203, and is sometimes customized in accordance with a user's specifications. For example, when a user requests a high-speed memory circuit with parallel output, I/O control circuit 204 may be constructed to simply pass eight bits in parallel directly from sense amplifier circuit 203 to parallel output terminal DOUT. In contrast, when a user requires serial or registered output signals, I/O control circuit 204 may be constructed to include a register for storing output signals before transmission to output terminal DOUT. I/O control circuit 204 is also utilized during programming to route bit data to metal lines MBL[0] through MBL[33] for storage in memory array 201. Additional detail regarding I/O control circuit 204 is discussed in the examples provided below.

Memory control circuit 205 receives address and command signals from an external system incorporating EEPROM 200, and generates control signals that are transmitted to memory array 201 and bit line control circuit 202. In some embodiments, command signals are also transmitted to I/O control circuit 204. The control signals generated by memory control circuit 205 produce appropriate voltage levels in memory array 201 to perform read, program and erase operations in selected memory blocks 100(1,1) through 100(8,Y). The control signals necessary to generate these appropriate voltage levels are discussed above. The circuitry of memory control circuit 205 is easily devised by those of ordinary skill in the art from known memory control circuitry known 2-bit non-volatile memory cells.

Figure 1:
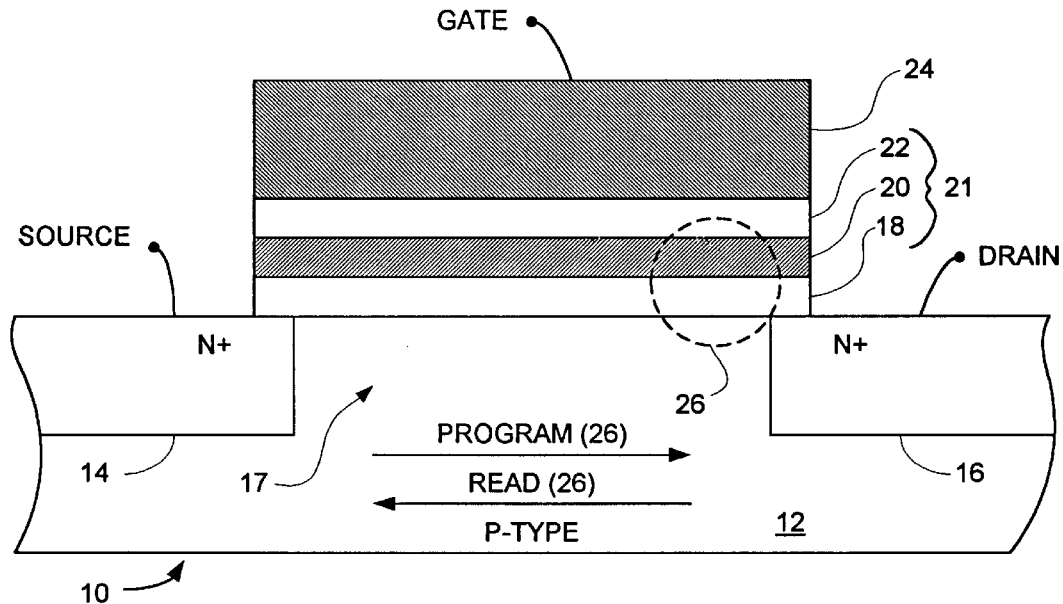
FIG. 1 is a cross sectional diagram illustrating a conventional 1-bit non-volatile memory cell.

Mode control memory 206 is a non-volatile circuit used to store configuration data that controls the operation mode of EEPROM 200. Mode control memory 206 can be, for example, a memory cell 10 (see FIGS. 1 and 2), a standard floating-gate memory cell, or a mask-programmable (i.e., "hard-wired") connection.

In accordance with the first embodiment, memory control circuit 205 reads the configuration data stored in mode control memory 206, and EEPROM 200 operates in accordance with the configuration data in either a high-speed 1-bit operation mode or a high-density 2-bit operation mode.

When EEPROM 200 operates in the 1-bit operation mode, only one of the two charge trapping regions of each memory cell is utilized to store data bits, thereby requiring a unique set of eight memory cells to store each eight-bit word. The eight memory cells storing the bits of each word are accessed simultaneously, thereby providing for high-speed read operations. In addition, programming and erasing operations are performed on a word-by-word basis, thereby providing true EEPROM functionality. Of course, because only one of the two charge trapping regions of each memory cell is utilized, the high-speed read capability associated with the 1-bit operation mode sacrifices 50% of the storage capacity of memory array 201.

In contrast, when EEPROM 200 is operated in the 2-bit operation mode, both charge trapping regions of each memory cell are utilized to store data bits. Therefore, in contrast to the 1-bit operation mode, the 2-bit operation mode allows high-density EEPROM operations because 100% of the storage capacity of memory array 201 is available for data storage. As mentioned above with reference to FIG. 3, in order to erase charge trapping region 2 of memory cell $M_1$, it is necessary to erase charge trapping region 3 of adjacent memory cell $M_2$. To provide true EEPROM functionality, charge trapping region 2 of memory cell $M_1$ and charge trapping region 3 of adjacent memory cell $M_2$ must store bits of the same word. However, because charge trapping region 2 of memory cell $M_1$ and charge trapping region 3 of adjacent memory cell $M_2$ cannot be read simultaneously, it is necessary to read each bit in two stages: a first bit is read from charge trapping region 2 during a first stage, then a second bit is read from charge trapping region 3 during a second stage. To read an eight-bit word, a first group of four bits are read from four charge trapping regions (i.e., located in four separate memory blocks located in one row of memory array 201) during the first stage, and a second group of four bits are read from adjacent charge trapping regions during the second stage. The two groups of four bits obtained during these two stages are stored and combined, for example, using a shift register, and then transmitted from memory structure 200 as an eight-bit word. Of course, speed is sacrificed in the high-density of the 2-bit operation mode because the read operation requires two stages. However, in applications where speed is not critical, the 2-bit operation mode provides twice the storage capacity of the 2-bit operation mode.

Accordingly, the present invention provides a single memory circuit that can be selectively programmed by a manufacturer to meet both high-speed and high-density EEPROM requirements. This reduces design efforts and associated costs because only a single module type is required to produce a memory array providing either of these specifications, thereby allowing the manufacturer to focus his resources on the particular output structure required by a customer.

Figure 6:
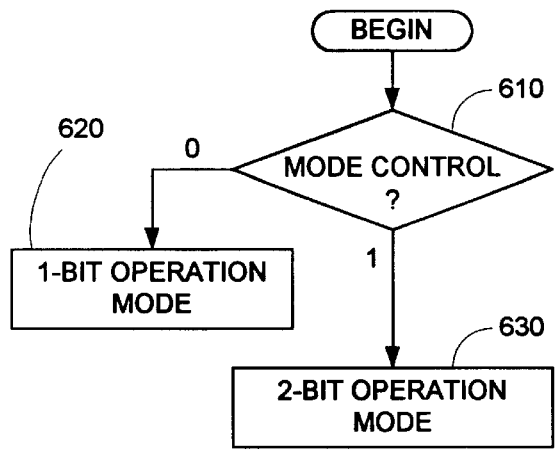
FIG. 6 is a flow diagram showing the optional operating modes of the memory system of FIG. 5.

FIG. 6 is a flow diagram illustrating a general process performed by memory control circuit 205 in accordance with the first embodiment of the present invention. Upon power-up of EEPROM 200, memory control circuit 205 reads the configuration data stored in mode control memory 206. In accordance with the configuration data (Step 610), memory control circuit 205 either enters a 1-bit operation mode (Step 620) or a 2-bit operation mode (Step 630).

Figure 7:
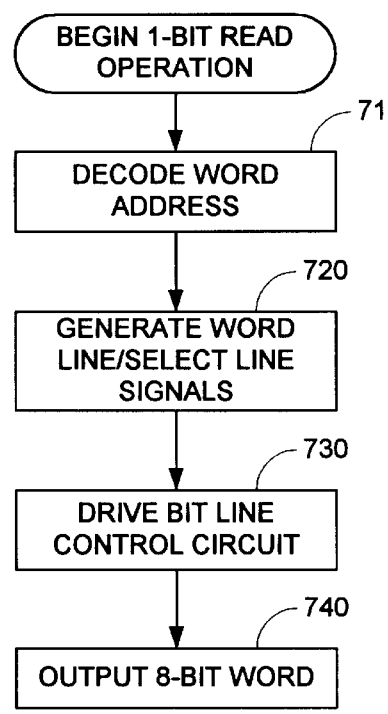
FIG. 7 is a flow diagram showing a read operation of the memory system during a 1-bit operation mode.
Figure 8:
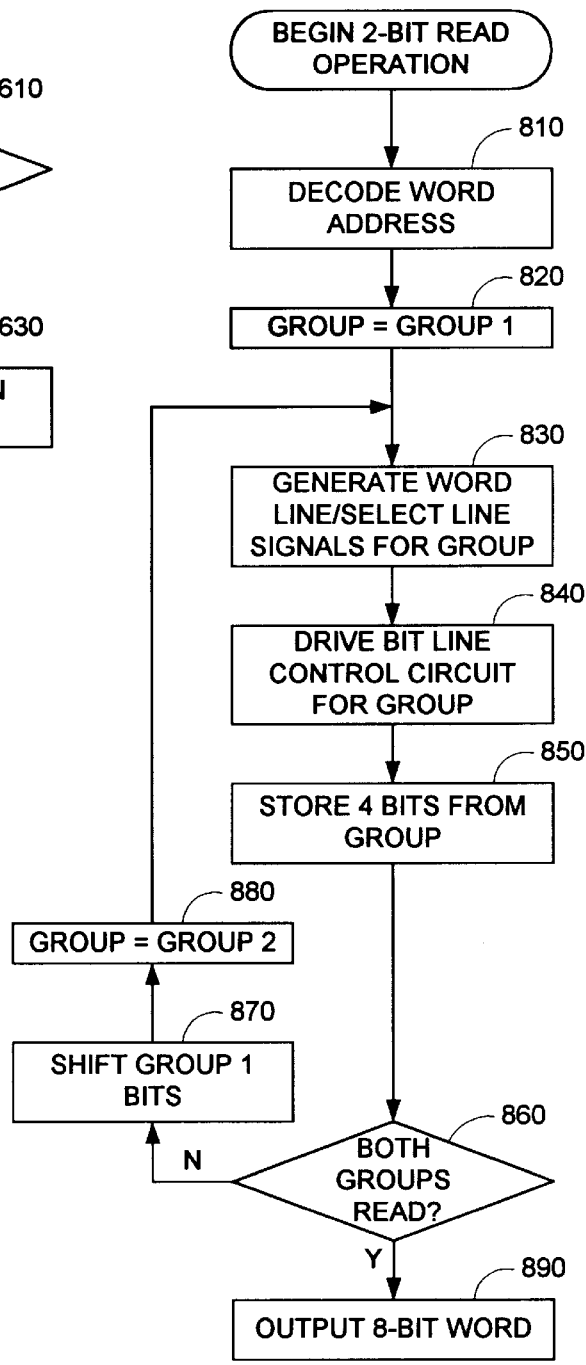
FIG. 8 is a flow diagram showing a read operation of the memory system during a 2-bit operation mode.

FIGS. 7 and 8 are flow diagrams illustrating basic steps performed by EEPROM 200 during the 1-bit operation mode and the 2-bit operation mode, respectively. Specifically, FIGS. 7 and 8 are directed to read operations performed in accordance with the 1-bit operation mode and the 2-bit operation mode. As discussed above, the amount of time required to read an eight-bit word is shorter in the 1-bit operation mode than in the 2-bit operation mode. Because the read operation time is typically important to customers, the following description is specifically directed to read operations. Operational steps associated with program and erase operations, which are typically less time critical, are performed in a manner similar to the steps described below with respect to read operations, and are therefore omitted for brevity.

FIG. 7 is a flow diagram illustrating basic steps performed by EEPROM 200 during a read operation in accordance with the 1-bit operation mode.

First, memory control circuit 205 decodes the address of the desired word (Step 710), and then generates the appropriate word line and select line signals (Step 720) and the appropriate control signals for bit line control circuit 202 (Step 730) that are required to read each bit of the eight-bit word from memory array 201. As discussed above, each bit of the eight-bit word is stored in a different memory block arranged along a row within memory array 201. For example, an eight-bit word stored in the uppermost row of memory array 201 would include a first bit stored in memory block 100(1,1), and an eighth bit stored in memory block 100(8,1). The remaining six bits of the word are stored in additional memory blocks (not shown) located between memory block 100(1,1) and 100(1,8). Referring to FIG. 3, each bit of the word is stored in a similar charge trapping region of each memory block. Therefore, a single set of word line, select line and bit line control signals is required to read all eight bits. For example, all eight bits of the word may be stored in the right charge trapping region 2 of memory cell $M_1$ in each memory block. As discussed above with reference to FIG. 3, the right charge trapping region 2 of memory cell $M_1$ in each block arranged in a row of memory array 201 is read by holding the word line WL at a voltage of 3 Volts, applying a voltage of 2 Volts to diffusion bit line 102, and coupling diffusion bit line 103 to sense amplifier circuit 203 (0 Volts). Consequently, during a read operation, the first bit is routed via metal bit line MBL[1] (corresponding to metal bit line 141 in FIG. 3) and the eighth bit is routed via metal bit line MBL[29] to bit line control circuit 202. Bit line control circuit 202 is controlled to couple these metal bit lines to sense amplifier 203, thereby routing the eight bits through sense amplifier 203 to I/O control circuit 204. Finally, the eight-bit word is transmitted via output terminal DOUT (Step 740).

FIG. 8 is a flow diagram illustrating basic steps performed by EEPROM 200 during a read operation in accordance with the 2-bit operation mode.

First, memory control circuit 205 decodes the address of the desired eight-bit word (Step 810). As discussed above, each eight-bit word is read out in two four-bit groups during two separate stages. Accordingly, the memory control circuit selects a first group (Group 1) of four bits for the first stage (Step 820). For example, an eight-bit word stored in the left-side, uppermost row of memory array 201 would include first and second bits stored in memory block 100(1, 1), third and fourth bits stored in a second memory block (not shown) located to the right of memory block 100(1,1), fifth and sixth bits stored in a third memory block (not shown), and seventh and eight bits stored in a fourth memory block (also not shown). Referring to FIG. 3, it is assumed that the first group of four bits is stored in charge trapping region 2 of memory cells $M_1$ in each of these memory blocks. Accordingly, a first read stage begins when memory control circuit 205 generates appropriate word line and select line control signals (Step 830) and appropriate bit line control signals (Step 840) such that data is read from the charge trapping regions of the first group. Referring to FIG. 3, the four bits of the first group are read from charge trapping region 2 of memory cell $M_1$ in each memory block. Similar to the process described above, the right charge trapping region 2 of memory cell $M_1$ in each block is read by holding the word line WL at a voltage of 3 Volts, applying a voltage of 2 Volts to diffusion bit line 102, and coupling diffusion bit line 103 to sense amplifier circuit 203 (0 Volts). Consequently, during the first stage of the 2-bit read operation, one of the four bits of the first group is routed via metal bit line MBL[L] (corresponding to metal bit line 141 in FIG. 3) to bit line control circuit 202. Similarly, the remaining three bits of the first group are routed via the fifth, ninth and thirteenth metal bit lines (not shown) to bit line control circuit 202. Bit line control circuit 202 is controlled to couple these metal bit lines to sense amplifier 203, thereby routing the four bits of the first group through sense amplifier 203 to I/O control circuit 204. In the first embodiment, I/O control circuit 204 is provided with a shift register for storing the four bits from the first group (Step 850) until the four bits from the second group are read.

After the first group of four bits is read and stored in the shift register located in I/O control circuit 204, control then passes to Step 860. If only the first group is read (N), control passes to Step 870 in which the first group of four bits is shifted within the shift register located in I/O control circuit 204, thereby making room for the second group (Group 2) of four bits. Control then passes to Step 880, where memory control circuit 205 is altered to access the second group of four bits for the second stage of the read operation. Referring to FIG. 3, the second group is stored in charge trapping region 3 of memory cells $M_2$ in each of these memory blocks. Accordingly, the second read stage begins when memory control circuit 205 generates appropriate word line and select line control signals (Step 830) and appropriate bit line control signals (Step 840) such that data is read from the charge trapping regions of the second group. When the four bits of the second group are read from charge trapping region 3 of memory cell $M_2$ in each memory block, the left charge trapping region 3 of memory cell $M_2$ in each block is read by holding the word line WL at a voltage of 3 Volts, applying a voltage of 2 Volts to diffusion bit line 104, and coupling diffusion bit line 103 to sense amplifier circuit 203 (0 Volts). Consequently, during the second stage of the 2-bit read operation, the first bit of the second group is routed via metal bit line MBL[1] to bit line control circuit 202. Similarly, the remaining three bits of the second group are routed via the fifth, ninth and thirteenth metal bit lines (not shown) to bit line control circuit 202. Bit line control circuit 202 is controlled to couple these metal bit lines to sense amplifier 203, thereby routing the four bits of the second group through sense amplifier 203 to the shift register located in I/O control circuit 204 (Step 850).

Now that both groups of four bits are stored in the shift register (Y in Step 860), control passes to Step 890, wherein the eight-bit word is transmitted from the shift register in accordance with a customer's specifications.

FIGS. 9(A) through 9(C) and FIGS. 10(A) through 10(C) respectively show two examples of methods that may be utilized to store data bits in the shift register of I/O control circuit 204 during the 2-bit read operation of FIG. 8. Of course, circuit arrangements and methods other than those described below may also be utilized.

Figure 9A:
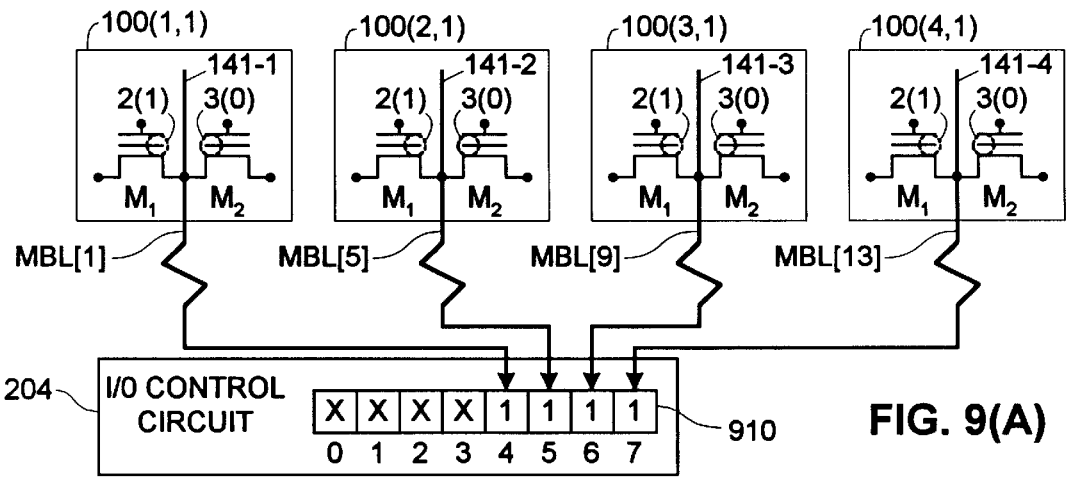
FIGS. 9(A), 9(B) and 9(C) are simplified block diagrams illustrating a data shifting method according to one embodiment of the present invention.
Figure 9B:
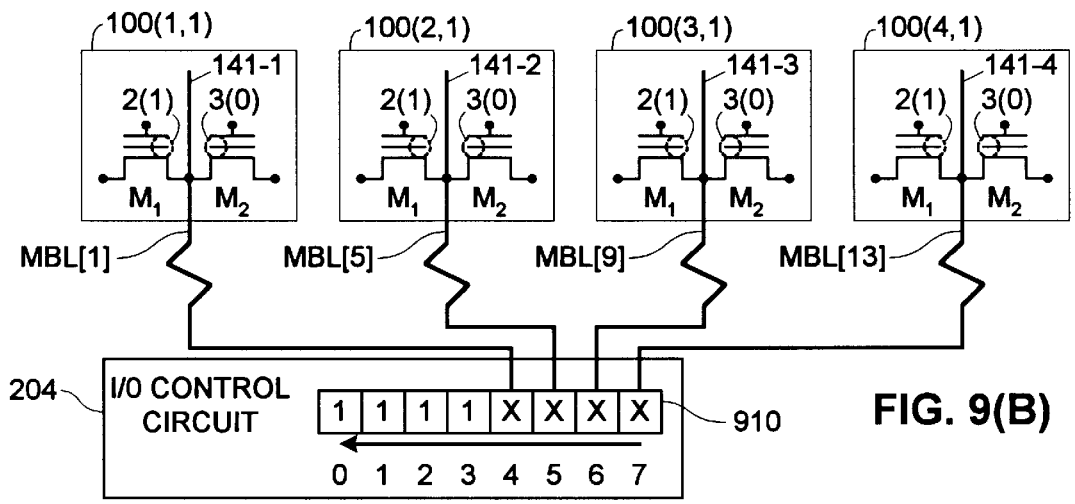
Figure 9C:
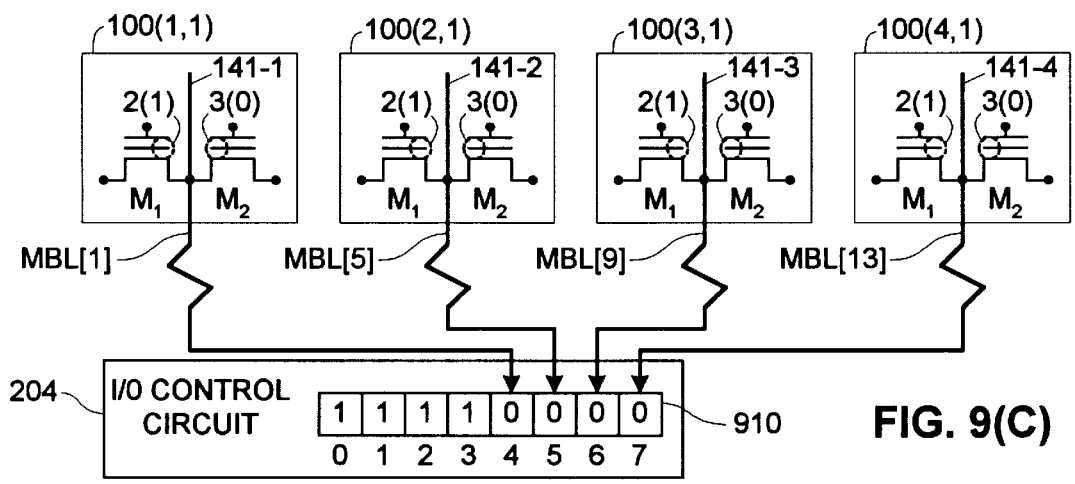

FIGS. 9(A) through 9(C) are partial block diagrams showing memory blocks 100-1 through 100-4 that are connected to I/O control circuit 204 in accordance with a first circuit arrangement and method. Referring to FIG. 9(A), the disclosed circuit arrangement is a simplified version of EEPROM 200 shown in FIG. 5. In particular, memory blocks 100(1,1) through 100(4,1) are part of a top row of memory array 201 (see FIG. 5); the remaining memory blocks are omitted. In addition, each memory block 100(1,1) through 100(4,1) includes the memory cell arrangement of memory block 100 shown in FIG. 3. To simplify the following description, only memory cells $M_1$ and $M_2$ of each memory block are shown; the remaining memory cells of each memory block are omitted. Further, a simplified connection is depicted from memory cells $M_1$ and $M_2$ to bit lines 141-1 through 141-4 in memory blocks 100(1,1) through 100(1,4), respectively; specifically, the diffusion and select transistors shown in FIG. 3 are omitted. Finally, connections between metal bit lines MBL[1], MBL[5], MBL[9] and MBL[13] and I/O control circuit 204 are simplified; bit line control circuit 202 and sense amplifier circuit 203 are omitted.

In the example shown in FIGS. 9(A) through 9(C), an eight-bit word is stored by charge trapping regions 2 of memory cells $M_1$ and charge trapping regions 3 of memory cells $M_2$ in each block 100(1,1) through 100(4,1). The logic value stored by each charge trapping region is indicated in parenthesis (i.e., each charge trapping region 2 is programmed to store a logic 1 data bit, and each charge trapping region 3 is programmed to store a logic 0 data bit.

Referring to FIG. 9(A), I/O control circuit 204 includes an eight-bit shift register 910 that has storage locations 0 through 7. Metal bit lines MBL[1] through MBL[4] are connected to least-significant storage locations 4 through 7 of shift register 910. As discussed above, during a first pass through steps 830 through 850 (see FIG. 8), the first group of four bits is stored in shift register 910. In the present example, these four bits are read from charge trapping regions 2 of memory cells $M_1$ of each block 100(1,1) through 100(4,1). Specifically, the logic 1 data bits from charge trapping regions 2 are respectively transmitted on bit lines 141-1 through 141-4 to metal bit lines MBL[1] through MBL[4], and through bit line control circuit 202 and sense amplifier circuit 203 (see FIG. 5) to I/O output circuit 204. As indicated by the arrows in FIG. 9(A), these logic 1 data bits are transmitted to least-significant storage locations 4 through 7 of shift register 910. Note that the "X" shown in the four most-significant storage locations 0 through 3 indicates "don't care".

FIG. 9(B) shows the subsequent shifting process performed in Step 870 (see FIG. 8). In accordance with the first example, the four bits of the first group are serially shifted from storage locations 4 through 7 into the four most significant storage locations 0 through 3 of shift register 910 (as indicated by the arrow located below shift register 910). This is shown in FIG. 9(B) by the four logic 1 data bits that are stored in the four most-significant storage locations 0 through 3 of shift register 910. Again, the "X" shown in least-significant storage locations 4 through 7 after the shifting process indicates "don't care".

FIG. 9(C) depicts the transmission of the second group of four bits during a second pass through steps 830 through 850 (see FIG. 8) to shift register 910. In the present example, these four bits are read from charge trapping regions 3 of memory cells $M_2$ of each block 100(1,1) through 100(4,1). Specifically, the logic 0 data bits from charge trapping regions 3 are respectively transmitted on bit lines 141-1 through 141-4 to metal bit lines MBL[1] through MBL[4], and through the bit line control circuit and the sense amplifier circuit (not shown) to least-significant storage locations 4 through 7 of shift register 910. As shown in FIG. 9(C), this second data transmission completes the eight bit word "11110000" stored in shift register 910, which is then transmitted to the output terminals of the memory array.

Figure 10A:
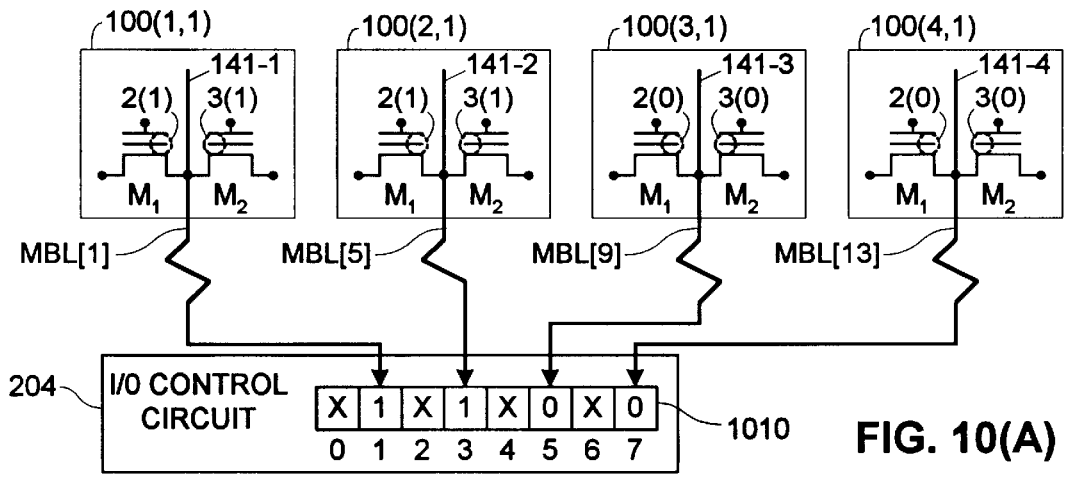
FIGS. 10(A), 10(B) and 10(C) are simplified block diagrams illustrating a data shifting method according to another embodiment of the present invention.
Figure 10B:
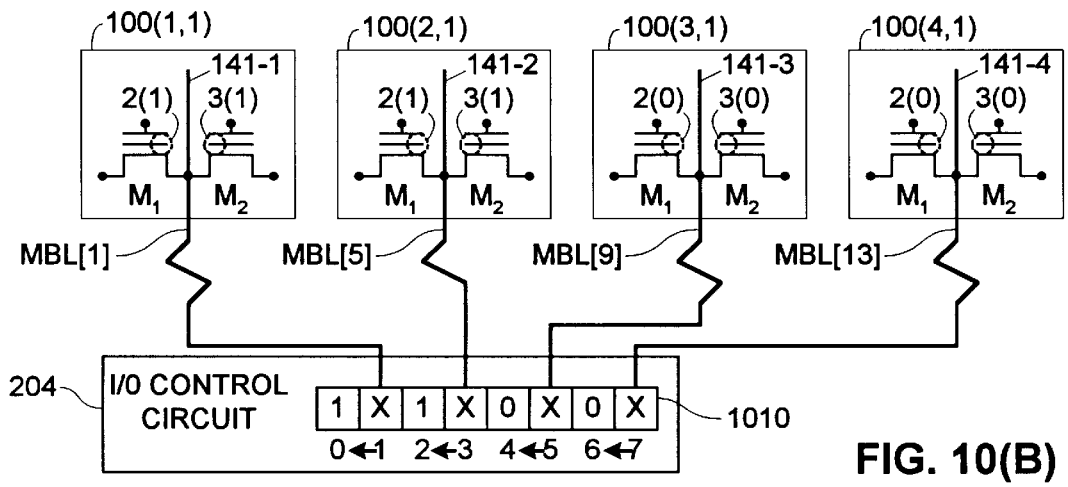
Figure 10C:
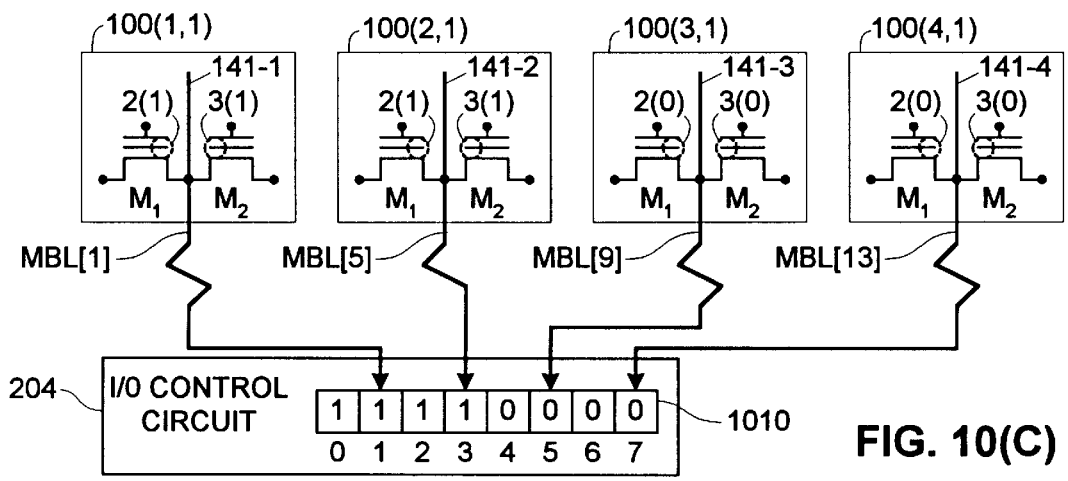

FIGS. 10(A) through 10(C) are partial block diagrams showing memory blocks 100(1,1) through 100(4,1) that are connected to I/O control circuit 204 in accordance with another circuit arrangement and method. The simplified circuit arrangement described above with respect to FIGS. 9(A) through 9(C) is also utilized in FIGS. 10(A) through 10(C). The difference between the circuit arrangement shown in FIGS. 10(A) through 10(C) and that of FIGS. 9(A) through 9(C) is the storage locations of the shift register into which the data bits are transmitted. Specifically, referring to FIG. 10(A), the data bits transmitted from memory blocks 100(1,1) through 100(4,1) are stored in the odd-numbered memory locations 1, 3, 5 and 7 of shift register 1010 in I/O control circuit 204. Note that this difference in circuit arrangement requires a different data storage pattern in memory cells $M_1$ and $M_2$ of memory blocks 100(1,1) through 100(4,1). That is, in order to store the eight-bit word "11110000", both charge trapping regions 2 and 3 of memory blocks 100(1,1) and 100(2,1) store logic 1 data bits, and both charge trapping regions 2 and 3 of memory blocks 100(3,1) and 100(4,1) store logic 0 data bits.

Referring to FIG. 10(A), during a first pass through steps 830 through 850 (see FIG. 8), the first group of four bits is stored in the odd-numbered storage locations of shift register 1010. Specifically, the logic 1 data bits from charge trapping regions 2 of memory blocks 100(1,1) and 100(2,1) are respectively transmitted on bit lines 141-1 and 141-2 to storage locations 1 and 3 of shift register 1010. Similarly, the logic 0 data bits from charge trapping regions 2 of memory blocks 100(3,1) and 100(4,1) are respectively transmitted on bit lines 141-3 and 141-4 to storage locations 5 and 7 of shift register 1010. Note that the "X" that is entered in each of storage locations 0, 2, 4 and 6 indicates "don't care".

FIG. 10(B) shows the subsequent parallel shifting process performed in Step 870 (see FIG. 8). In accordance with the second example, the four bits of the first group are shifted in parallel from odd-numbered storage locations 1, 3, 5 and 7 into even-numbered storage locations 0, 2, 4 and 6, respectively, of shift register 1010 (as indicated by the arrows located below shift register 1010). Again, the "X" shown in storage locations 1, 3, 5 and 7 after the shifting process indicates "don't care".

FIG. 10(C) depicts the transmission of the second group of four bits during a second pass through steps 830 through 850 (see FIG. 8) to shift register 1010. In the present example, these four bits are read from charge trapping regions 3 of memory cells $M_2$ of each block 100(1,1) through 100(4,1). Specifically, the logic 1 data bits from charge trapping regions 3 of memory blocks 100(1,1) and 100(2,1) are respectively transmitted on bit lines 141-1 and 141-2 to storage locations 1 and 3 of shift register 1010. Similarly, the logic 0 data bits from charge trapping regions 3 of memory blocks 100(3,1) and 100(4,1) are respectively transmitted on bit lines 141-3 and 141-4 to storage locations 5 and 7 of shift register 1010. As shown in FIG. 10(C), this second data transmission completes the eight bit word "11110000" stored in shift register 1010, which is then transmitted to the output terminals of the memory array.

Figure 11:
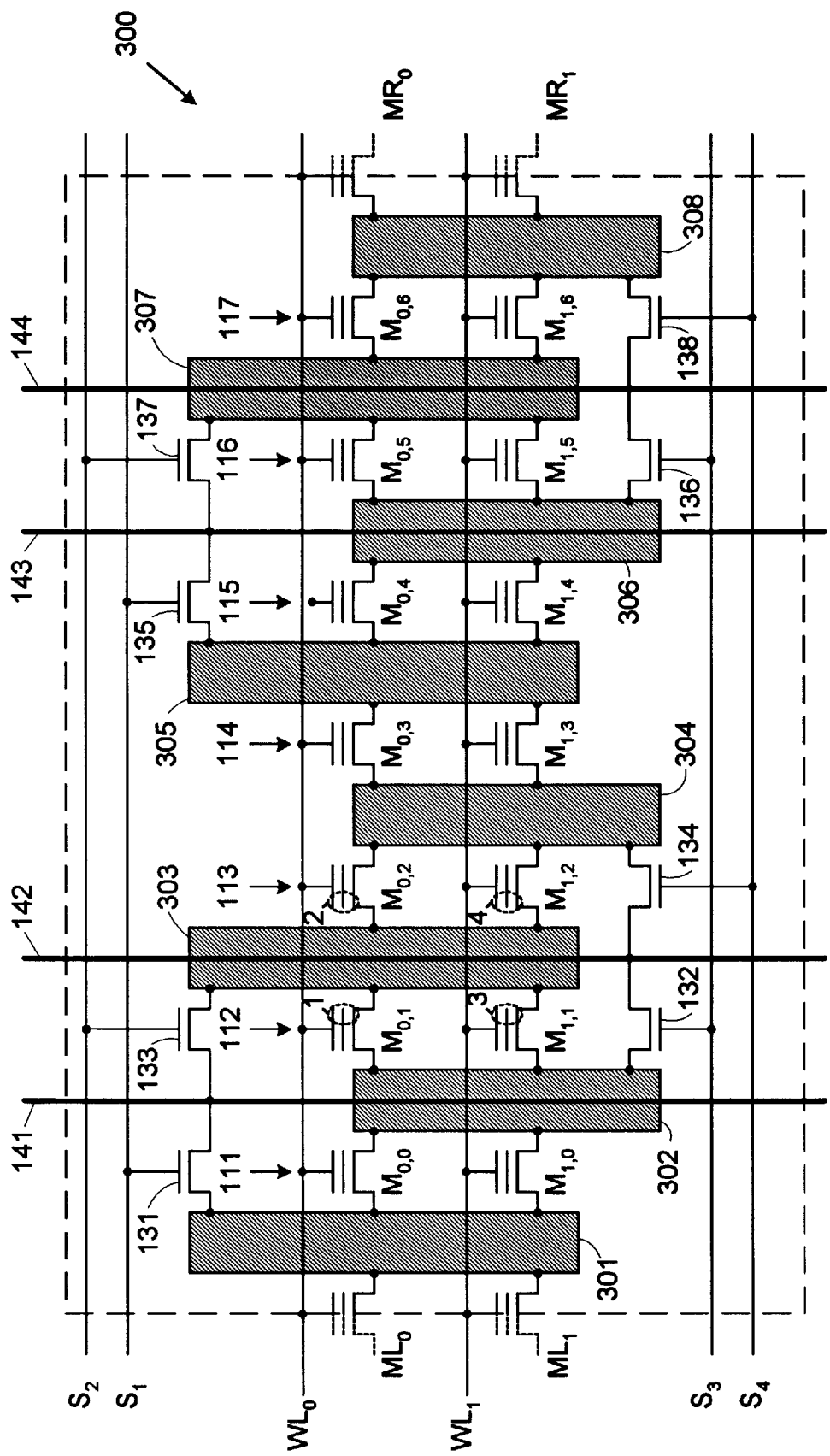
FIG. 11 is a schematic diagram illustrating a memory block utilized in accordance with a second embodiment of the present invention.

FIG. 11 is a schematic diagram of a memory block 300 in accordance with a second embodiment of the present invention. Because memory block 300 is similar to memory block 100 (FIG. 3), similar elements in FIGS. 3 and 11 are given similar reference numbers. Thus, memory block 300 includes memory cells $M_{0,0}$–$M_{1,6}$, shared memory cells $ML_0$–$ML_1$ and $MR_0$–$MR_1$, select transistors 131–138 and metal bit lines 141–144. Diffusion bit lines 101–108 of memory block 100 are replaced by diffusion bit lines 201–208 in memory block 300. As illustrated in FIG. 11, memory block 300 has two rows of memory cells, which include memory cells $M_{0,0}$–$M_{1,6}$ and shared memory cells $ML_0$–$ML_1$ and $MR_0$–$MR_1$. As a result, the diffusion bit lines 201–208 of memory block 200 are longer along the second axis than the diffusion bit lines 101–108 of memory block 100. Select transistors 131–138 are connected to diffusion bit lines 201–208 in the same manner that select transistors 131–138 are connected to diffusion bit lines 101–108 in memory block 100 (FIG. 3). Similarly, select transistors 131–138 are connected to metal bit lines 141–144 and select lines S1–S4 in the manner previously described for memory block 100 (FIG. 3).

The addition of a second row of memory cells does not significantly increase the size of memory block 300. Select transistors 131 through 138 are significantly larger than the memory cells to provide a small drain-to-source voltage drop so that the voltage drop across the memory cells is maximized. In accordance with one embodiment, each select transistor occupies an area of 14 $\mu m^2$, whereas each memory cell occupies approximately 0.6 $\mu m^2$. Consequently, the additional row of memory cells has little effect on the overall size of block 300, and doubles the potential storage capacity.

In accordance with the second embodiment, memory block 300 is incorporated in an EEPROM similar to that shown in FIG. 5. Namely, memory blocks 300 are arranged in rows and columns in place of memory blocks 100. Of course, memory control circuit 205 is modified to address the additional word lines associated with memory blocks 300, and is also modified to operate in accordance with the 4-bit operation mode, described below. However, it is again noted that the addition of a second row of memory cells to each memory block 300 does not cause a significant increase in the size of memory array 201 because of the relatively small size of the memory cells versus the size of the select transistors.

Figure 12:
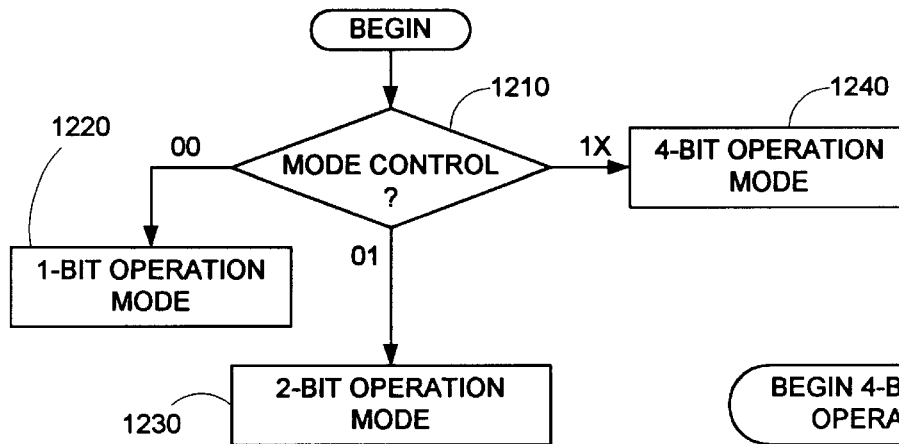
FIG. 12 is a flow diagram showing the optional operating modes of a memory system according to the second embodiment.

FIG. 12 is a flow diagram illustrating a general process performed in accordance with the second embodiment of the present invention. Upon power-up, a memory control circuit (similar to memory control circuit 205 in FIG. 5) reads the configuration data stored in a mode control memory (similar to mode control memory 206 in FIG. 5). Depending upon the value stored in the configuration data (Step 1210), the memory control circuit enters one of a 1-bit operation mode (Step 1220), a 2-bit operation mode (Step 1230), or a 4-bit operation mode (Step 1240). The 1-bit operation mode and the 2-bit operation mode are performed in a manner similar to that described above with reference to the first embodiment. That is, in the 1-bit operation mode, only one charge trapping region connected to each bit line is used to store data. For example, referring to FIG. 11, of the four charge trapping regions 1 through 4 connected to diffusion bit line 302, only charge trapping region 1 is used to store data (charge trapping regions 2 through 4 are not used). In the 2-bit operation mode, both charge trapping regions in only one row connected to each bit line are used to store data. For example, referring again to FIG. 11, of the four charge trapping regions 1 through 4 connected to diffusion bit line 302, only charge trapping regions 1 and 2 are used to store data (charge trapping regions 3 and 4 are not used). Because the steps associated with a read operation during the 1-bit and 2-bit operation modes are similar to those shown in FIGS. 7 and 8, respectively, these steps are omitted for brevity.

In accordance with the second embodiment, memory block 300 is selectively operated in a 4-bit operation mode whereby all four charge trapping regions connected to each bit line are used to store data. Referring to FIG. 11, memory block 300 is controlled as follows during the 4-bit operation mode. Each diffusion bit line 201–208 in memory block 300 is coupled to four charge trapping regions. For example, diffusion bit line 203 is coupled to charge trapping regions 1–4. These four charge trapping regions 1–4 store four bits of an 8-bit word. The other four bits of this 8-bit word are stored in another memory block (not shown) that is identical to memory block 300 and is connected to word lines $WL_0$ and $WL_1$. The elements of the other memory block (now shown) are connected in the same manner as the elements of memory block 300, and this other memory block includes four additional charge trapping regions that store the other four bits of the 8-bit word.

Figure 13:
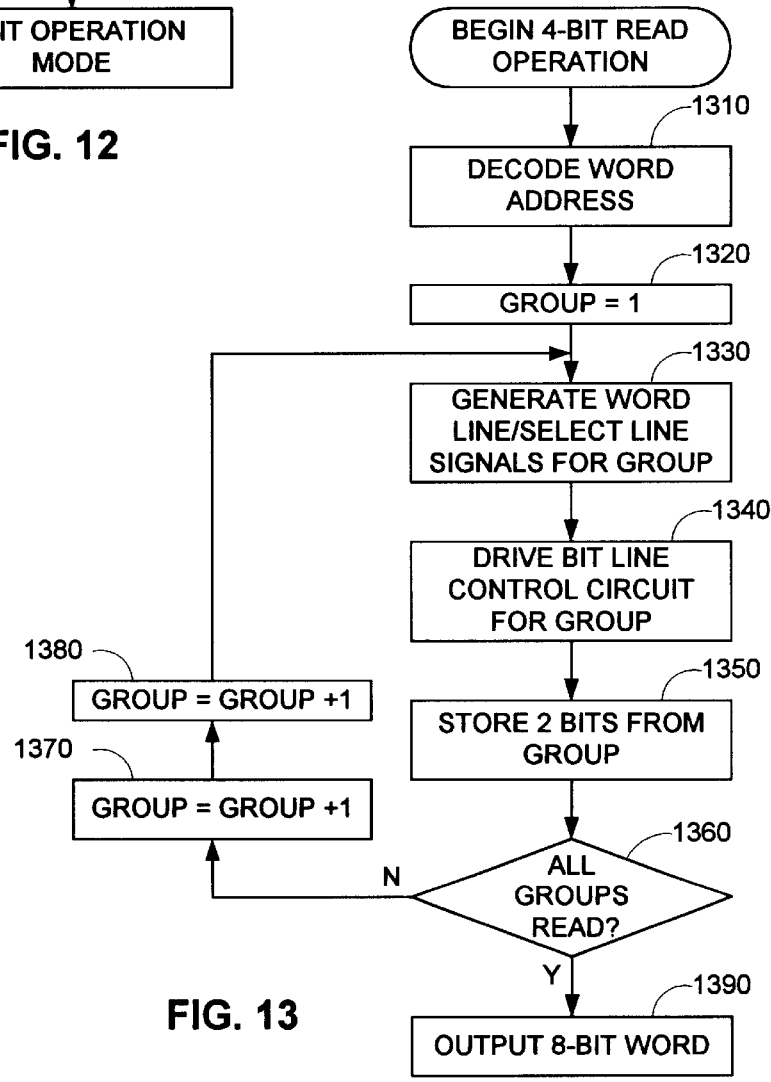
FIG. 13 is a flow diagram showing a read operation of the memory system during a 4-bit operation mode according to the second embodiment.

FIG. 13 is a flow diagram illustrating basic steps performed by an EEPROM incorporating memory blocks 300 during a read operation in accordance with the 4-bit operation mode.

First, the memory control circuit decodes the address of the desired eight-bit word (Step 1310). As discussed above, each eight-bit word is read out in four two-bit groups during four separate stages. Accordingly, the memory control circuit selects a first group (Group=1) of two bits for the first stage (Step 1320). Referring to FIG. 11, it is assumed that four bits are stored in charge trapping regions 1 through 4 in one memory block 300, and four bits are stored in charge trapping regions 1 through 4 in an associated second memory block 300 (not shown). In one embodiment, the bits stored in charge trapping regions 1 of the two associated memory blocks form the first two-bit group. Accordingly, a first read stage begins when the memory control circuit generates appropriate word line and select line control signals (Step 1330) and appropriate bit line control signals (Step 1340) such that data is read from the charge trapping regions of the first two-bit group. The two bits of the first group are routed through a sense amplifier (similar to sense amplifier 203 of FIG. 5) to an I/O control circuit. In the second embodiment, the I/O control circuit is provided with a shift register for storing the two bits of the first group (Step 1350). If all eight bits are not yet stored in the shift register (Step 1360), the previously-stored bits in the shift register are shifted (Step 1370), the addressed group is updated (Step 1380) and the process of addressing and storing two bits is repeated until all eight bits are stored in the shift register. After all eight bits are stored in the shift register the eight-bit word is transmitted from the I/O control circuit (Step 1190) to an output terminal or terminals.

The above-described second embodiment can be further modified to provide a third embodiment in which an 8-bit word is stored in four memory blocks. In this third embodiment each of the memory blocks has four rows of memory cells, and each 8-bit word is stored on charge trapping regions coupled to one diffusion bit line. The configuration data is modified to allow an additional choice of an 8-bit operation mode during which the eight bits of each word are transmitted via a single bit line, and are read during eight separate stages. Of course, this greatly increases the time required to read each word. However, as mentioned above, because the memory cell size is much smaller than the select transistor size, the additional rows do not significantly increase the overall size of the memory array. Therefore, an EEPROM produced in accordance with the third embodiment can be selectively configured to provide the high-speed 1-bit operation mode (described above), a high-density 8-bit operation mode that provides eight times the storage capacity of the 1-bit operation mode. Moreover, in addition to the 1-bit and 4-bit operation modes, the EEPROM can be configured to operate in either of the 2-bit or 4-bit operation modes, thereby providing a memory circuit that is highly flexible for a wide range of potential applications.

Although the invention has been described in connection with several embodiments, it is understood that this invention is not limited to the embodiments disclosed, but is capable of various modifications which would be apparent to a person skilled in the art. For example, although the memory blocks have been described as having eight diffusion bit lines, four metal bit lines and eight select transistors, it is understood that memory blocks having different numbers of diffusion bit lines, metal bit lines and select transistors can be constructed. Moreover, although memory blocks 100 and 300 have been described as having one row of memory cells and two rows of memory cells, respectively, it is understood that other numbers of memory cell rows can be used in other embodiments. In addition, although the charge trapping regions have been described in connection with an ONO structure, it is understood that the these charge trapping regions can be implemented by other layers, such as a layer of silicon oxide having buried polysilicon islands. Moreover, elements other than the described select transistors can be used to provide access to the memory cells. Thus, the invention is limited only by the following claims.

What is claimed is:

1. A electrically erasable programmable read only memory (EEPROM) comprising:

an array including a plurality of 2-bit non-volatile memory transistors, each memory transistor including a first charge trapping region and a second charge trapping region;

a memory control circuit for controlling the array such that bit information transmitted to the array is stored in selected charge trapping regions of selected memory transistors of the array; and a mode control circuit for controlling the memory control circuit to selectively operate either in a first mode, in which bit information is only stored in the first charge trapping region of selected memory transistors of the array, or in a second mode, in which bit information is stored in both the first charge trapping region and in the second charge trapping region of said selected memory transistors of the array.

2. The EEPROM according to claim 1, wherein the array comprises a word line connected to the memory control circuit, and a plurality of memory blocks arranged in a row, each memory block including:

a first memory cell having a gate connected to the word line;

a second memory cell including a gate connected to the word line; and a diffusion bit line connected between cell and st memory cell and the second memory cell;

wherein in the first mode, bit information for a word is stored in the first charge trapping region of the second memory cell in each of the plurality of memory blocks, and wherein in the second mode, bit information for the word is stored in the second charge trapping region of the first memory cell and the first charge trapping region of the second memory cell in some of the plurality of memory blocks.

3. The EEPROM according to claim 2, wherein the array further comprises:

a bit line; and a select transistor connected between the diffusion bit line and the bit line, the select transistor having a gate connected to the memory control circuit;

wherein the memory control circuit includes means for transmitting a first data bit stored in the second charge trapping region of the first memory cell via the select transistor to the bit line during a first read cycle, and for transmitting a second data bit stored in the first charge trapping region of the second memory cell via the select transistor to the bit line during a second read cycle.

4. The EEPROM according to claim 3, further comprising an input/output control circuit [204] including a shift register [910,1010] for storing a first group of data bits transmitted from the second charge trapping region of the first memory cell from some of the plurality of memory blocks during the first read cycle, and for storing a second group of data bits transmitted from the first charge trapping region of the second memory cell from said some of the plurality of memory blocks during the second read cycle.

5. The EEPROM according to claim 4, wherein the shift register [910] comprises a plurality of bit storage locations [0–7] including a plurality of least-significant storage locations [4–7] and a plurality of most-significant storage locations [0–3], wherein the first group of data bits are transmitted to the plurality of least-significant storage locations [4–7] during the first read cycle, and wherein the second group of data bits is transmitted to the plurality of least-significant storage locations [4–7] during the second read cycle.

6. The EEPROM according to claim 4, wherein the shift register [1010] comprises a plurality of bit storage locations [0–7] including odd-numbered storage locations [1,3,5,7] and a plurality of even-numbered storage locations [0,2,4,6], wherein the first group of data bits are transmitted to the plurality of odd-numbered storage locations [1,3,5,7] during the first read cycle, and wherein the second group of data bits is transmitted to the plurality of odd-numbered storage locations [1,3,5,7] during the second read cycle.

7. The EEPROM according to claim 1, wherein the array comprises a first word line connected to the memory control circuit, a second word line connected to the memory control circuit, and a plurality of memory blocks arranged in a row, each memory block including:

a first memory cell having a gate connected to the first word line;

a second memory cell including a gate connected to the first word line;

a third memory cell having a gate connected to the second word line;

a fourth memory cell including a gate connected to the second word line; and a diffusion bit line connected to the first memory cell, the second memory cell, the third memory cell and the fourth memory cell;

wherein in the first mode, bit information for a word is stored in the first charge trapping region of the second memory cell in all of the plurality of memory blocks, wherein in the second mode, bit information for the word is stored in the second charge trapping region of the first memory cell and the first charge trapping region of the second memory cell in one-half of the plurality of memory blocks, and wherein the mode control circuit further comprises means for controlling the memory control circuit to selectively operate in a third mode, in which bit information for the word is stored in the second charge trapping regions of the first memory cell and the third memory cell, and in the first charge trapping regions of the second memory cell and the fourth memory cell in one-fourth of the plurality of memory blocks.

8. The EEPROM according to claim 7, wherein the array further comprises:

a bit line; and a select transistor connected between the diffusion bit line and the bit line, the select transistor having a gate connected to the memory control circuit;

wherein the memory control circuit includes means for transmitting a first data bit stored in the second charge trapping region of the first memory cell via the select transistor to the bit line during a first read cycle, for transmitting a second data bit stored in the first charge trapping region of the second memory cell via the select transistor to the bit line during a second read cycle, for transmitting a third data bit stored in the second charge trapping region of the third memory cell via the select transistor to the bit line during a third read cycle, and for transmitting a fourth data bit stored in the first charge trapping region of the fourth memory cell via the select transistor to the bit line during a fourth read cycle.

9. A method of reading information from an electrically erasable programmable read only memory (EEPROM), the EEPROM including an array of 2-bit non-volatile memory transistors, each memory transistor including a first charge trapping region and a second charge trapping region, the method comprising the steps of:

reading configuration data from a mode control circuit;

operating the EEPROM in either a first mode or a second mode in response to the configuration data, wherein operation in the first mode includes storing bit information only in the first charge trapping region of selected memory transistors of the array, and operation in the second mode includes storing bit information in both the first charge trapping region and in the second charge trapping region of said selected memory transistors of the array.

10. The method according to claim 9, wherein the array comprises a word line connected to the memory control circuit, and a plurality of memory blocks arranged in a row, each memory block including:

a first memory cell having a gate connected to the word line;

a second memory cell including a gate connected to the word line; and a diffusion bit line connected between the first memory cell and the second memory cell;

wherein the step of operating in the first mode further comprises storing bit information for a word in the first charge trapping region of the second memory cell in each of the plurality of memory blocks, and wherein the step of operating in the second mode further comprises storing bit information for the word in the second charge trapping region of the first memory cell and the first charge trapping region of the second memory cell in some of the plurality of memory blocks.

11. The method according to claim 10, wherein the array further comprises:

a bit line; and a select transistor connected between the diffusion bit line and the bit line, the select transistor;

wherein the method further comprises the steps of:

transmitting a first data bit stored in the second charge trapping region of the first memory cell via the select transistor to the bit line during a first read cycle, and transmitting a second data bit stored in the first charge trapping region of the second memory cell via the select transistor to the bit line during a second read cycle.

12. The method according to claim 11, wherein the step of transmitting the first data bit further comprises storing in a shift register a first group of data bits transmitted from the second charge trapping region of the first memory cell from some of the plurality of memory blocks during the first read cycle, wherein the step of transmitting the second data bit further comprises storing in the shift register a second group of data bits transmitted from the first charge trapping region of the second memory cell from said some of the plurality of memory blocks during the second read cycle, and wherein the method further comprises shifting the first group of data bits in the shift register from a first plurality of storage locations to a second plurality of storage locations before storing the second group of data bits in the first plurality of storage locations.

13. The method according to claim 12, wherein the step of shifting the first group comprises serially shifting the first group of data bits from a plurality of least-significant storage locations to a plurality of most-significant storage locations.

14. The method according to claim 12, wherein the step of shifting the first group comprises parallel shifting the first group of data bits from a plurality of odd-numbered storage locations to a plurality of even-numbered storage locations.

15. The method according to claim 9, wherein the array includes:

a first word line connected to the memory control circuit, a second word line connected to the memory control circuit, and a plurality of memory blocks arranged in a row, each memory block including:

a first memory cell having a gate connected to the first word line, a second memory cell including a gate connected to the first word line, a third memory cell having a gate connected to the second word line, a fourth memory cell including a gate connected to the second word line, and a diffusion bit line connected to the first memory cell, the second memory cell, the third memory cell and the fourth memory cell;

wherein the step of operating in the first mode further comprises storing bit information for a word in the first charge trapping region of the second memory cell in all of the plurality of memory blocks, wherein the step of operating in the second mode further comprises storing bit information for the word in the second charge trapping region of the first memory cell and the first charge trapping region of the second memory cell in one-half of the plurality of memory blocks, and wherein the method further comprises selectively operating the EEPROM in a third mode including storing bit information for the word in the second charge trapping regions of the first memory cell and the third memory cell, and in the first charge trapping regions of the second memory cell and the fourth memory cell in one-fourth of the plurality of memory blocks.

16. The method according to claim 15, wherein the array further includes:

a bit line; and a select transistor connected between the diffusion bit line and the bit line, the select transistor;

wherein the method further comprises the steps of:

transmitting a first data bit stored in the second charge trapping region of the first memory cell via the select transistor to the bit line during a first read cycle, transmitting a second data bit stored in the first charge trapping region of the second memory cell via the select transistor to the bit line during a second read cycle, transmitting a third data bit stored in the second charge trapping region of the third memory cell via the select transistor to the bit line during a third read cycle, and transmitting a fourth data bit stored in the first charge trapping region of the fourth memory cell via the select transistor to the bit line during a fourth read cycle.

* * * * *